United States Patent
Suh et al.

(10) Patent No.: US 7,099,196 B2
(45) Date of Patent: *Aug. 29, 2006

(54) FLASH MEMORY DEVICE AND PROGRAM VERIFICATION METHOD THEREOF

(75) Inventors: Kang-Deog Suh, Kyunggi-do (KR); Yeong-Tack Lee, Seoul (KR); Jin-Wook Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 118 days.

This patent is subject to a terminal disclaimer.

(21) Appl. No.: 10/712,652

(22) Filed: Nov. 12, 2003

(65) Prior Publication Data

US 2004/0095807 A1 May 20, 2004

(30) Foreign Application Priority Data

Nov. 18, 2002 (KR) .................... 10-2002-0071599

(51) Int. Cl.
*G11C 16/34* (2006.01)

(52) U.S. Cl. .................... 365/185.22; 365/185.19; 365/185.23

(58) Field of Classification Search ............... None
See application file for complete search history.

(56) References Cited

U.S. PATENT DOCUMENTS 5,343,434 A * 8/1994 Noguchi ............... 365/185.04
5,521,864 A * 5/1996 Kobayashi et al. ..... 365/185.22
5,574,684 A * 11/1996 Tomoeda ............... 365/185.04
5,661,685 A * 8/1997 Lee et al. .............. 365/185.22
5,675,540 A * 10/1997 Roohparvar ........... 365/185.22
5,696,717 A * 12/1997 Koh ...................... 365/185.22
5,768,191 A * 6/1998 Choi et al. ............. 365/185.22
5,812,457 A * 9/1998 Arase .................... 365/185.22
5,889,698 A * 3/1999 Miwa et al. ........... 365/185.03
5,953,253 A * 9/1999 Devin et al. ........... 365/185.22
6,538,923 B1 * 3/2003 Parker ................... 365/185.03
6,853,585 B1 * 2/2005 Lee et al. .............. 365/185.22
2002/0154545 A1 * 10/2002 Tanaka et al. ......... 365/185.22

* cited by examiner

*Primary Examiner*—Tan T. Nguyen
(74) *Attorney, Agent, or Firm*—Marger Johnson & McCollom, P.C.

(57) ABSTRACT

Disclosed is a flash memory device and a program verification method thereof which can prevent a misjudgment as to whether flash memory cells are programmed or not. The flash memory device includes: a program verification voltage generator for variably generating program verification voltages used to verify whether the flash memory cells are programmed or not and a word line level selector for transferring the program verification voltages to word lines connected to control gates of the flash memory cells. The flash memory cells that are verified as uncertain as to whether the flash memory cells are programmed or not can be completely programmed since the program verification operation is carried out with program verification voltage levels that are changed according to the selective activations of the program verification control signals.

23 Claims, 8 Drawing Sheets

FLASH MEMORY DEVICE AND PROGRAM VERIFICATION METHOD THEREOF

This application claims priority from Korean Patent Application No. 2002-71599, filed on Nov. 18, 2002, the contents of which are herein incorporated by reference in their entirety.

TECHNICAL FIELD

This disclosure relates to a semiconductor memory device, and more particularly, to a flash memory device that uses variable program verification voltages.

BACKGROUND

A flash memory device is a nonvolatile high-density data storage device that can write and erase data on-board. A flash memory cell includes a field effect transistor (FET) having a selection gate, a floating gate, a source and a drain. Data is stored in the flash memory cell by variations in the amount of charge stored in the floating gate, which causes a variation in a threshold voltage (Vt) of the flash memory cell. The data stored in the flash memory cell is read out by applying a selection voltage to a word line connected to the selection gate. The amount of current, which flows when the flash memory cell is selected, is determined by the threshold voltage (Vt) of the flash memory cell.

A flash memory cell generally has two states, i.e., "programmed" and "erased." If the flash memory cell is programmed, excess electrons are trapped on the floating gate and the threshold voltage (Vt) rises, so that only a small amount of drain-source current flows across the flash memory cell when the cell is selected to be read. The programmed state of the flash memory cell is called a logic "0". If the flash memory cell is erased, there are few or no excess electrons on the floating gate, causing a large amount of source-drain current to flow across the flash memory cell when the cell is selected to be read. The erased state of the flash memory cell is called a logic "1".

FIG. 1 is a schematic diagram of a conventional flash memory device. Referring to FIG. 1, the conventional flash memory cell 100 includes a memory cell array block 110, a row decoder 120, a word line level selection block 130, a driver block 140, and a page buffer 150. The memory cell array block 110 includes i number of strings 200, 202, 204, and 206, each of which has flash memory cells connected in series with each other. The first string 200 includes flash memory cells 112, 113, and 114 connected in series with each other, whose gates are connected from the first to the sixteenth word lines WLj (j=0, 1, . . . , 15), respectively. The flash memory cell 112, connected to the first word line WL0, has a drain connected to a first selection transistor 111, whose gate is connected to a string selection line SSL. The flash memory cell 114, connected to the sixteenth word line WL15, has a source connected to a second selection transistor 115, whose gate is connected to a ground selection line GSL. The first selection transistor 111 has a drain connected to a first bit line BL0, and the second selection transistor 115 has a source connected to a common source line CSL.

The strings 200, 202, 204, and 206 are connected with the string selection line SSL, the first to sixteenth word lines WLj (j=0, 1, . . . , 15), and the ground selection line GSL. Additionally, each of the strings 200, 202, 204, and 206 is connected to the page buffer 150 through the bit lines BL0, BL1, BLi-1 and BLi to form one page unit. Although FIG. 1 shows only one page unit contained in the memory cell array block 110 for convenience, the memory cell array block 110 can actually include a number of page units. The page units are addressed by the row decoder 120. Transistors contained in the driver block 140 are turned on in response to addressing signals of the row decoder 120, so that one page unit is selected.

The word line level selection block 130 selects a programming voltage VPGM, a read voltage VREAD, a program verification voltage VRDV, or a pass voltage VPASS according to a corresponding mode, and transfers the selected voltage to the driver block 140. The programming voltage VPGM and the read voltage VREAD are applied during the programming operation and the read operation of the selected flash memory cells, respectively. The program verification voltage VRDV is applied to verify whether the flash memory cell is programmed or not. The pass voltage VPASS is applied to make non-selected flash memory cells electrically "turned on" and thus cause a cell current to flow therethrough. The driver block 140 applies the corresponding mode voltage to the word lines WLj (j=0, 1, . . . , 15) of one selected page unit in response to an addressing signal of the row decoder 120. The page buffer 150 senses the cell current flowing through the bit lines BL0, BL1, . . . , BLi-1 and BLi, and interprets data from the selected flash memory cells.

After the programming operation, the flash memory device 100 repeatedly performs a cycle ("program unit loop") that carries out the program verification operation. As a result of the program verification operation, if it is verified that the flash memory cells are programmed, the programming operation is ended, and if not, the programming operation is carried out once more and the program verification operation is repeated. For example, if a large number of flash memory cells are connected to a single word line, predetermined cycles are required to program all of the flash memory cells and to verify their programs. Once verified that the flash memory cells connected to the selected word line are completely programmed, flash memory cells connected to another word line are programmed and their programs are verified.

If the program operation and the program verification operation are repeatedly performed to one selected word line, a problem may be caused where the programming operation is prematurely ended by misjudging underprogrammed flash memory cells as programmed. The reason is, as shown in FIG. 2, that as the programming voltage VPGM increases and the program verification voltage VRDV is constantly applied during the repeated program unit loops, the cell current increases due to the flash memory cells that are underprogrammed during the first several program unit loops, thereby causing an increase of the level of the common source line CSL. Here, if the program verification voltage VRDV is constantly applied throughout the program unit loops, the cell current decreases due to an increase in the level of the common source line CSL. Accordingly, the flash memory cells that are actually underprogrammed may be misjudged as programmed.

FIG. 3 is a graph of example threshold voltage distributions of flash memory cells during the program verification operation of FIG. 2. Referring to FIG. 3, in an initial state, when the erase operation is performed to all flash memory cells, the threshold voltage (Vt) of the flash memory cells has a negative voltage level. The program unit loops are then sequentially performed and the flash memory cells are programmed by the high programming voltage VPGM at the last loop. As a result, the threshold voltage (Vt) is distributed non-uniformly at the high end. This non-uniform distribution of the high threshold voltage (Vt) causes a problem of overprogramming the flash memory cells of the page unit. Additionally, the flash memory cells having a low threshold voltage (Vt), similar to the program verification voltage VRDV, may remain in an underprogrammed state because it is uncertain whether the flash memory cells are programmed or not.

Embodiments of the invention address these and other limitations in the prior art.

SUMMARY OF THE INVENTION

There is a demand for a flash memory device and a program verification method thereof, which can prevent a misjudgment as to whether the flash memory cells are programmed or not.

Accordingly, embodiments of the present invention provide a flash memory device and a program verification method which can prevent a misjudgment as to whether flash memory cells are programmed or not. Additionally, embodiments of the invention are able to provide a substantially uniform distribution of the threshold voltage across programmed memory cells.

Additional advantages and features of the invention will be set forth in part in the description which follows and in part will become apparent to those having ordinary skill in the art upon examination of the following or may be learned from practice of the invention. The features and advantages of the invention may be realized and attained by the structure particularly pointed out in the written description and claims hereof as well as the appended drawings.

It is to be understood that the following detailed description of the present invention is exemplary and explanatory and is intended to provide further explanation of the invention as claimed.

BRIEF DESCRIPTION OF THE DRAWINGS

The accompanying drawings are included to provide a further understanding of embodiments of the invention. In the drawings.

DETAILED DESCRIPTION OF THE INVENTION

Reference will now be made in detail to embodiments of the present invention, examples of which are illustrated in the accompanying drawings. However, the present invention is not limited to the embodiments illustrated hereinafter, and the embodiments herein are rather introduced to provide easy and complete understanding of the scope and spirit of the present invention.

Figure 1:
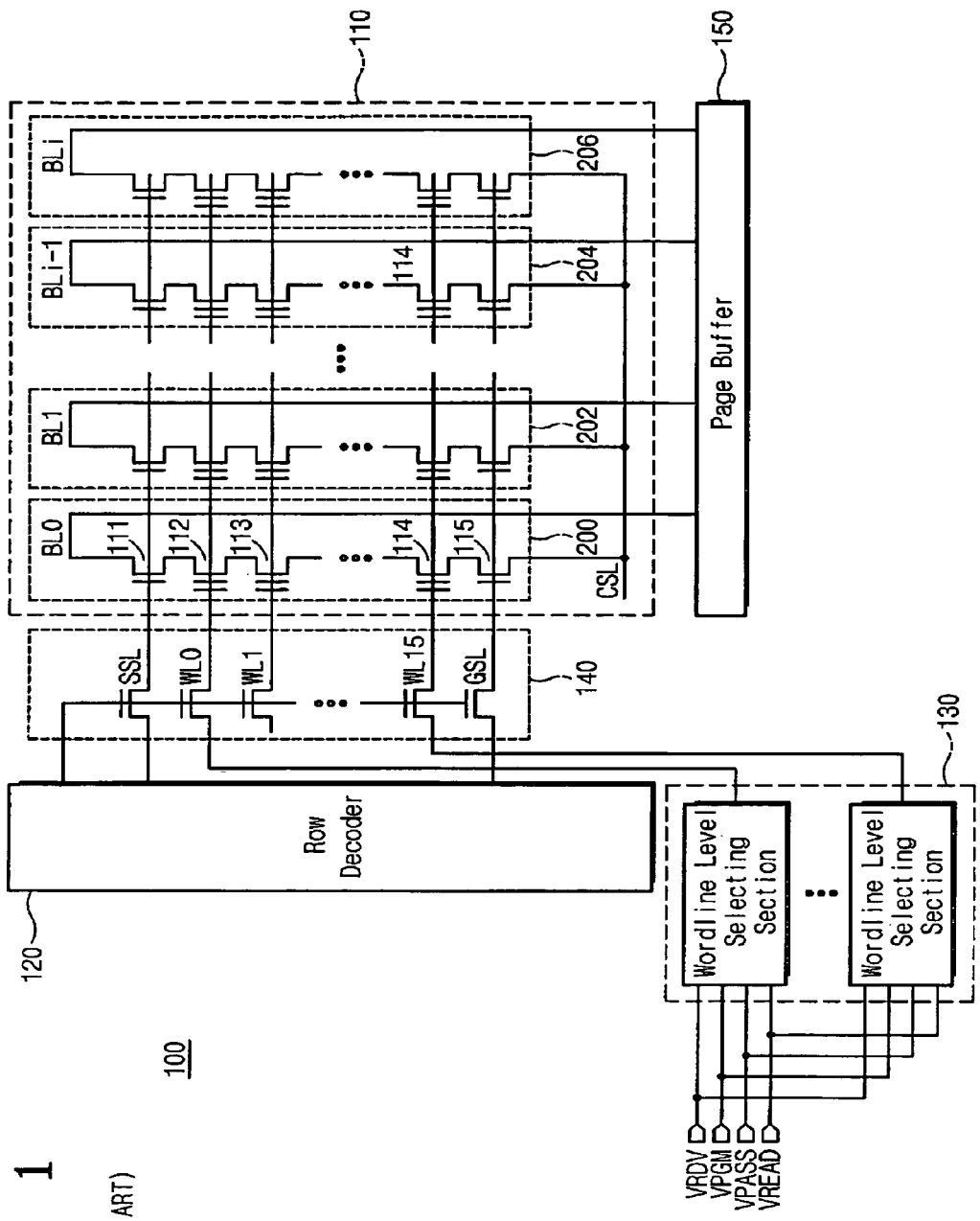
FIG. 1 is a schematic diagram of a conventional flash memory device.
Figure 2:
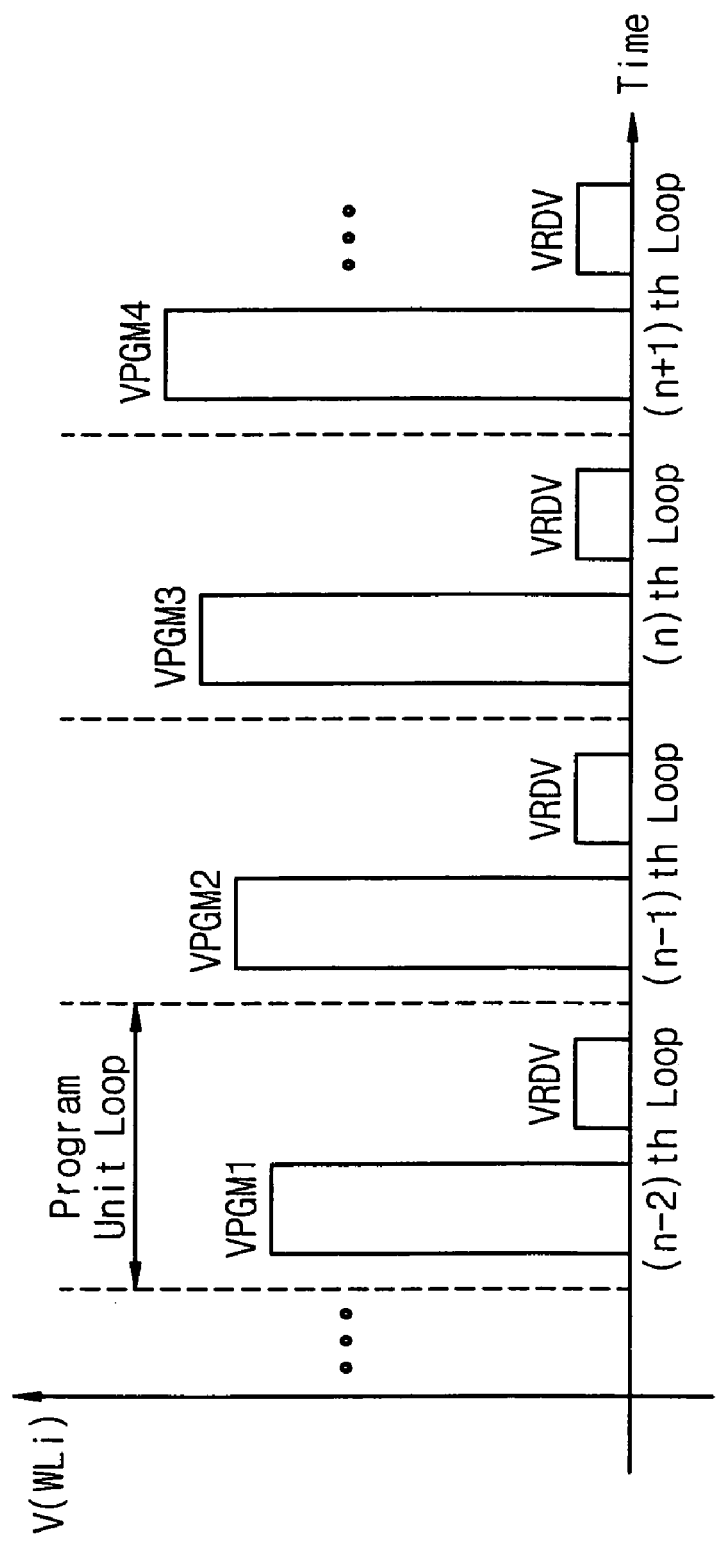
FIG. 2 is a timing diagram of a program verification of the conventional flash memory device shown in FIG. 1.
Figure 3:
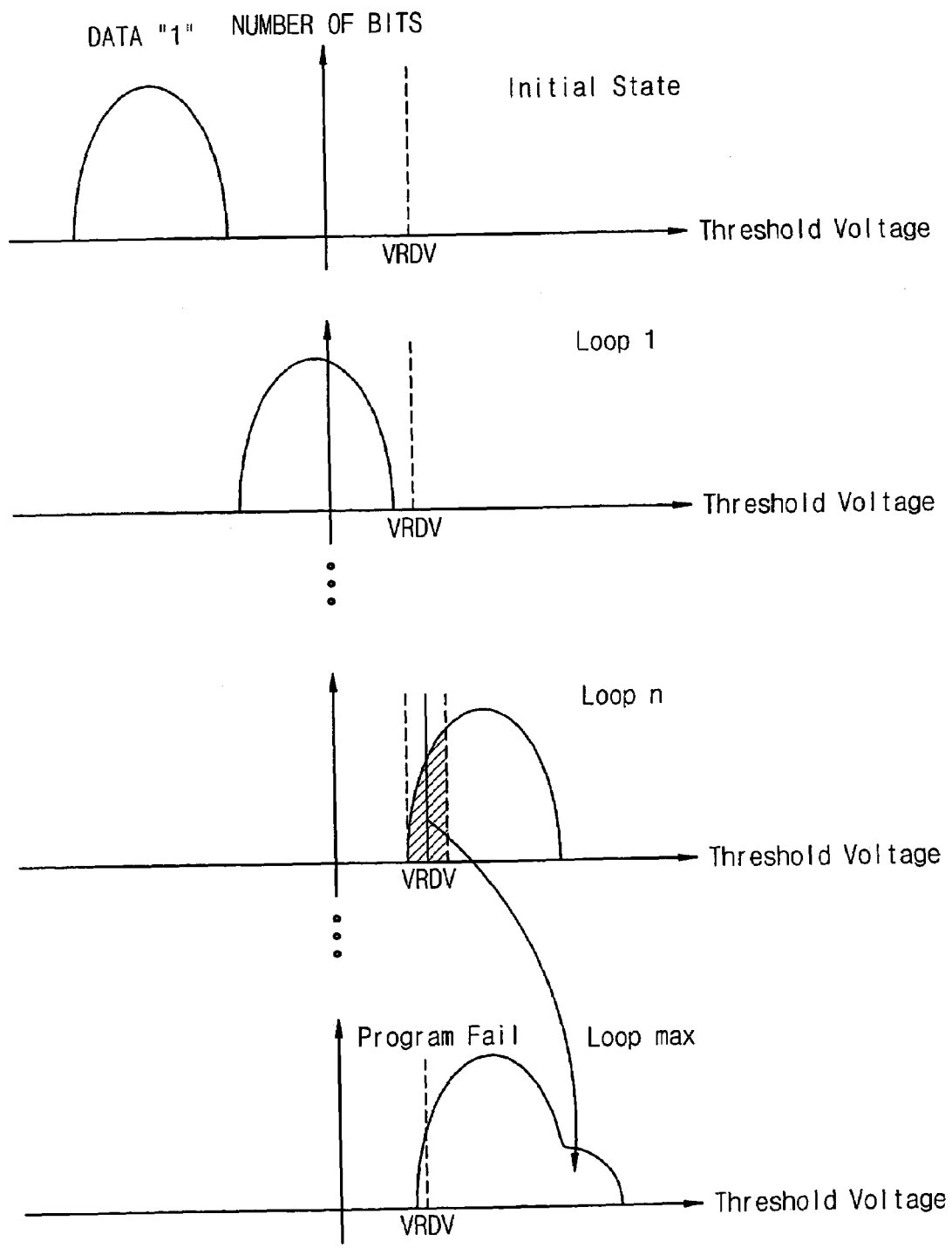
FIG. 3 is a series of graphs to illustrate threshold voltage distributions of flash memory cells according to the program verification operation of FIG. 2.
Figure 4:
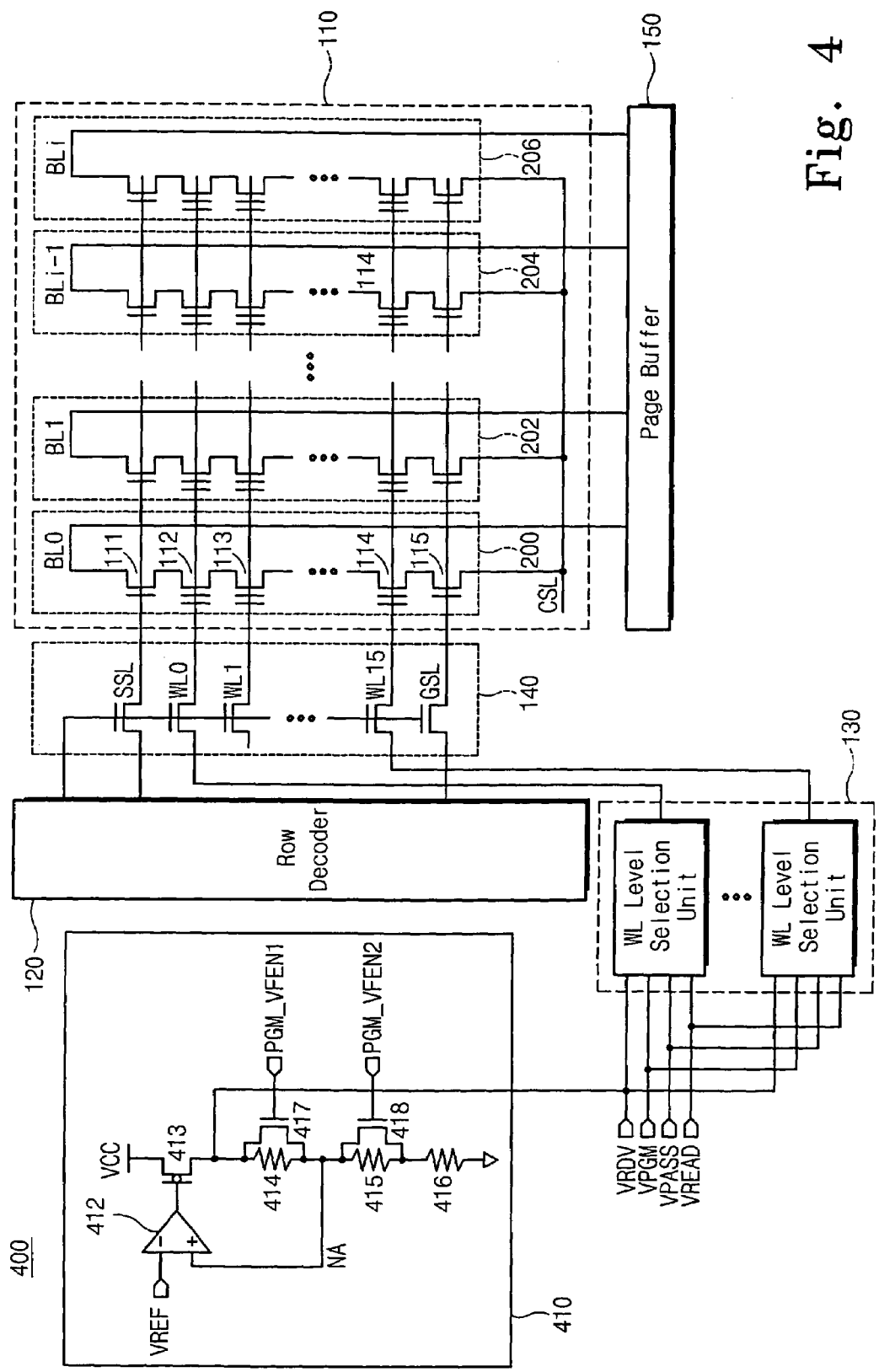
FIG. 4 is a schematic diagram of a flash memory device according to an embodiment of the present invention.

FIG. 4 is a view of a flash memory device according to an embodiment of the present invention. Compared with the conventional flash memory device of FIG. 1, the flash memory device 400 further includes a program verification voltage generator 410. The program verification voltage generator 410 includes a PMOS transistor 413 connected to a power supply voltage VCC, a first NMOS transistor 417 connected to both terminals of a first resistor 414, a second NMOS transistor 418 connected to both terminals of a second resistor 415, and a third resistor 416 connected from the second NMOS transistor 418 to a ground reference voltage. The PMOS transistor 413 is gated to an output of a comparator 412 that compares a reference voltage VREF to a voltage of a node NA between the first and second resistors. The first NMOS transistor 417 is gated to a first program verification control signal PGM_VFEN1 to make the first resistor 414 electrically shorted, and the second NMOS transistor 418 is gated to a second program verification control signal PGM_VFEN2 to make the second resistor 415 electrically shorted.

The program verification voltage generator 410 causes the first or second resistor 414 or 415 to be selectively shorted according to an activation of the first or second program verification control signal PGM_VFEN1 or PGM_VFEN2. This allows the program verification voltage VRDV to be generated at a high or low voltage level. If the first and second program verification control signals PGM_VFEN1 and PGM_VFEN2 are inactivated, the program verification voltage VRDV is generated to a high voltage level. If, however, the first and second program verification control signals PGM_VFEN1 and PGM_VFEN2 are activated, the program verification voltage VRDV is generated to a low voltage level. Additionally, if the first or second program verification control signal PGM_VFEN1 or PGM_VFEN2 is selectively activated, the program verification voltage VRDV is generated to one of two intermediate voltage levels between the high voltage level and the low voltage level.

Figure 5:
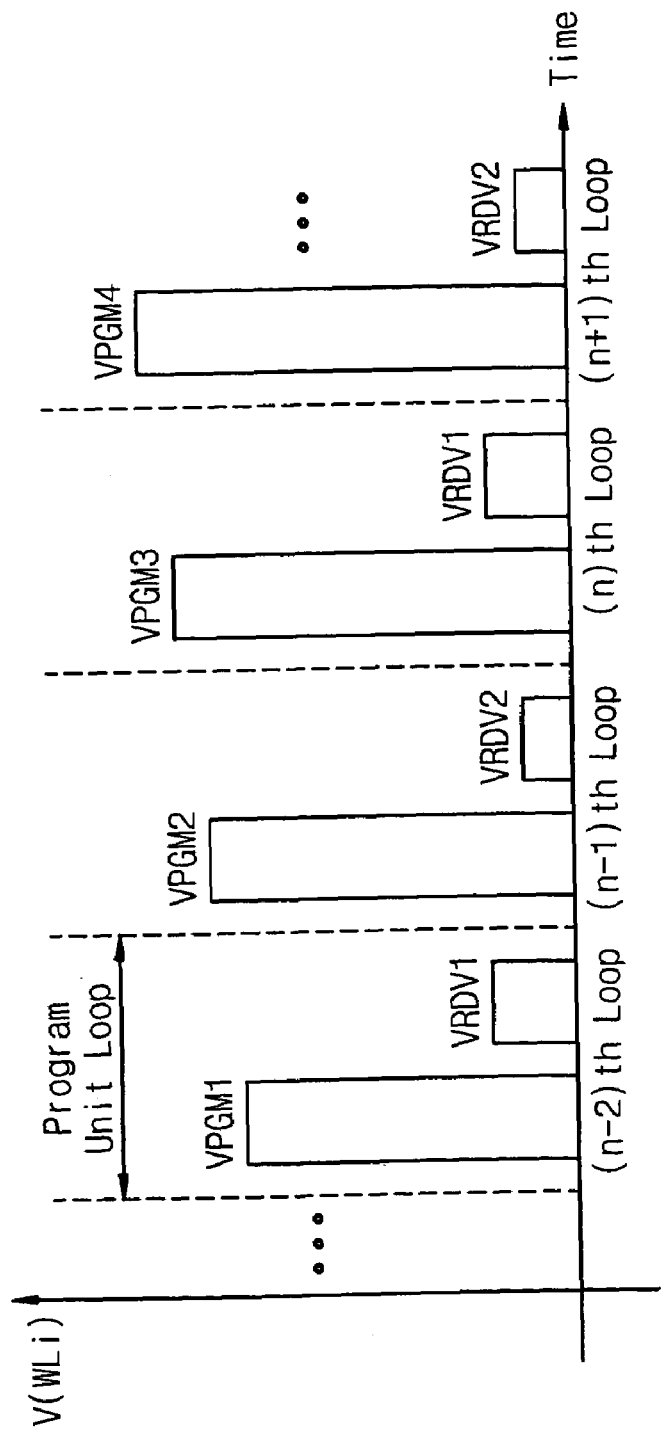
FIG. 5 is a timing diagram of a program verification, in which program verification voltages according to an embodiment of the present invention are applied.

FIG. 5 is a timing diagram of the program verification according to an embodiment of the present invention, in which the program verification voltage VRDV generated by the program verification voltage generator 410 is applied thereto. At an (n−2)th program unit loop, the programming operation is carried out with a first programming voltage VPGM1 and then the program verification operation is carried out with a first program verification voltage VRDV1. At an (n−1)th program unit loop, the programming operation is carried out with a second programming voltage VPGM2 and then the program verification operation is carried out with a second program verification voltage VRDV2, which has a lower voltage level than the first program verification voltage VRDV1. At an nth program unit loop, the programming operation is carried out with a third programming voltage VPGM3 and then the program verification operation is carried out with the first program verification voltage VRDV1, which has a higher voltage level than the second program verification voltage VRDV2. At an (n+1)th program unit loop, the programming operation is carried out with a fourth programming voltage VPGM4 and then the program verification operation is carried out with the second program verification voltage VRDV2, which has a lower voltage level than the first program verification voltage VRDV1.

As described above, if the program verification operations are carried out with voltage levels that are higher or lower than the precedent program verification voltage VRDV at each program unit loop, flash memory cells actually underprogrammed are verified as "programmed" at the second program verification voltage VRDV2 and then as "underprogrammed" at the first program verification voltage VRDV1, so that the programming operation is resumed. Accordingly, the underprogrammed flash memory cells are completely programmed.

Figure 6:
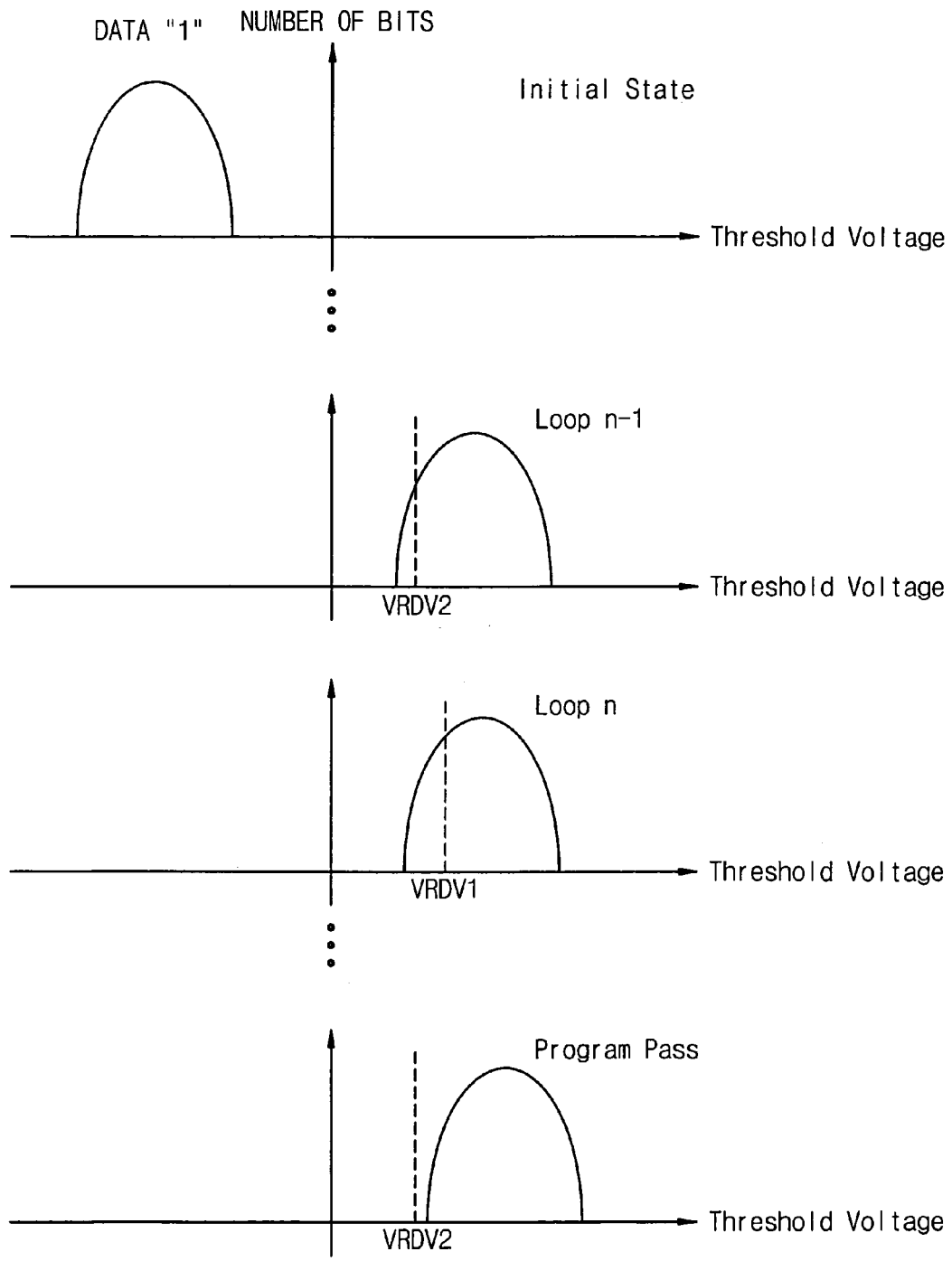
FIG. 6 is a series of graphs to illustrate threshold voltage distributions of flash memory cells according to the program verification of FIG. 5.

FIG. 6 illustrates example threshold voltage distributions of the flash memory cells according to the program verification of embodiments of the present invention. Referring to FIG. 6, in an initial state after the erase operation is performed to all flash memory cells, the threshold voltage (Vt) of the flash memory cells has a negative voltage level. Thereafter, the program verification voltages VRDV are changed at the program unit loops. At the (n−1)th program unit loop, it is uncertain whether the flash memory cells having a threshold voltage (Vt) of about the second program verification voltage VRDV2 are programmed or not. At the nth program unit loop, the flash memory cells having a threshold voltage (Vt) lower than the first program verification voltage VRDV1, i.e., the flash memory cells whose programs are judged as "uncertain", are verified as underprogrammed, so that the programming operation is resumed. Therefore, at the last program unit loop, the threshold voltage (Vt) of the flash memory cells is uniformly distributed, so that underprogrammed flash memory cells and overprogrammed flash memory cells are eliminated.

Figure 7:
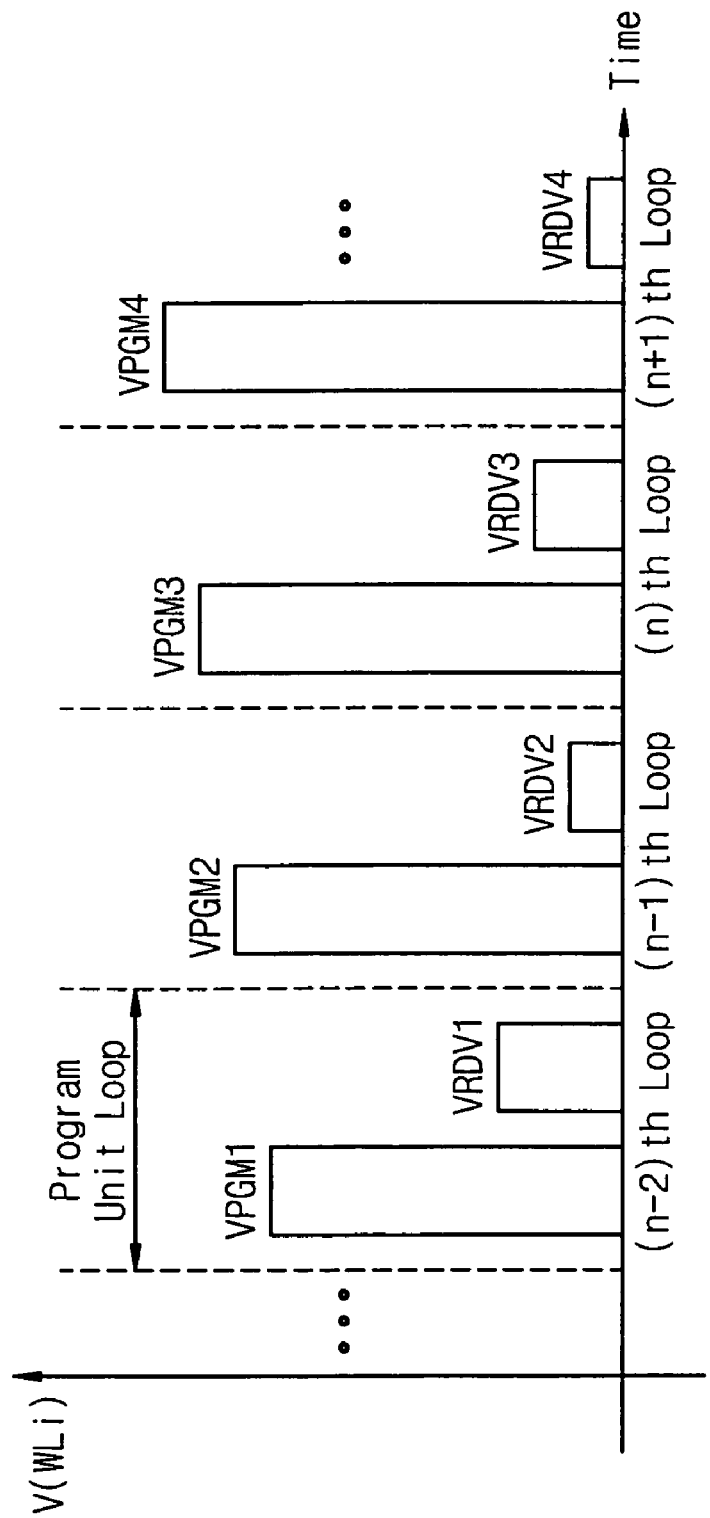
FIG. 7 is a timing diagram of a program verification, in which program verification voltages according to another embodiment of the present invention are applied.

FIG. 7 is a timing diagram of a program verification, in which program verification voltages are applied according to another embodiment of the present invention. Referring to FIG. 7, at the sequential program unit loops, the program operation is carried out while increasing the programming voltages VPGM1, VPGM2, VPGM3, and VPGM4 at each loop. Then the program verification operation is carried out with the program verification voltages VRDV1, VRDV2, VRDV3 and VRDV4. The first to fourth program verification voltages VRDV1, VRDV2, VRDV3 and VRDV4 each have different voltage levels from each other.

Figure 8:
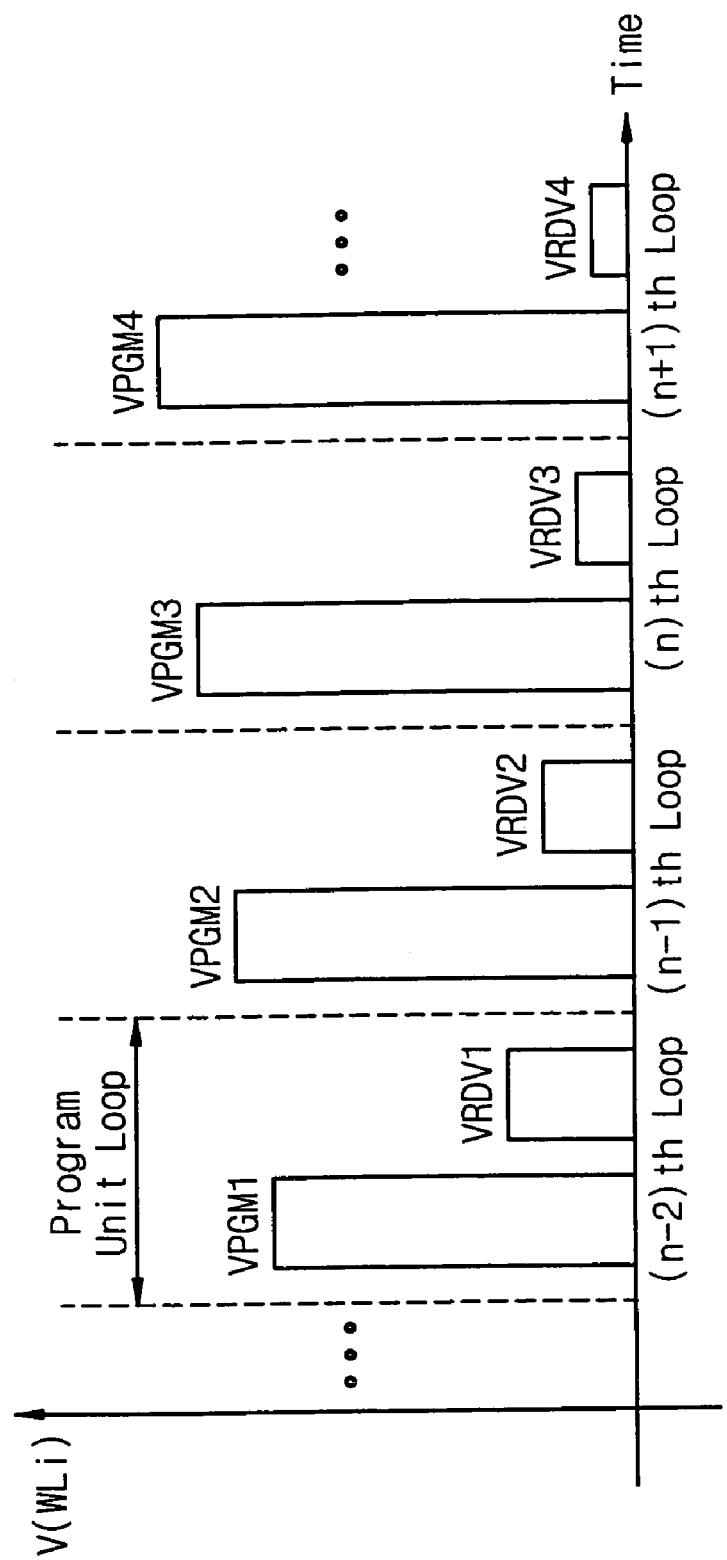
FIG. 8 is a timing diagram of a program verification, in which program verification voltages according to yet another embodiment of the present invention are applied.

FIG. 8 is a timing diagram of a program verification, in which program verification voltages are applied according to yet another embodiment of the present invention. Referring to FIG. 8, a program verification voltage VRDV3 at an nth program unit loop is set to a lower level than a program verification voltage VRDV2 at an (n−1)th program unit loop, and a program verification voltage VRDV4 at an (n+1)th program unit loop is set to a lower level than a program verification voltage VRDV3 at the nth program unit loop. In another manner, a program verification voltage VRDV3 at an nth program unit loop can be set to a higher level than a program verification voltage VRDV2 at an (n−1)th program unit loop, and a program verification voltage VRDV4 at an (n+1)th program unit loop can be set to a higher level than a program verification voltage VRDV3 at the nth program unit loop.

According to embodiments of the present invention, the flash memory cells that are verified as uncertain as to whether they are programmed or not can be completely programmed since the program verification operation is carried out while changing the program verification voltage levels.

In an aspect of the present invention, there is provided a flash memory device which includes: a memory cell array block having a plurality of flash memory cells arrayed therein; a program verification voltage generator for variably generating program verification voltages to verify whether the flash memory cells are programmed or not; and a word line level selector for transferring the program verification voltages to word lines connected to control gates of the flash memory cells.

Preferably, the program verification voltage generator includes: a PMOS transistor and first to third resistors, which are connected in series between a power supply voltage and a ground voltage; a first NMOS transistor connected to both terminals of the first resistor, for making the first resistor electrically shorted in response to a first program verification control signal and generating the program verification voltage at a node between drains of the PMOS transistor and the first NMOS transistor; a second NMOS transistor connected to both terminals of the second resistor, for making the second resistor electrically shorted in response to a second program verification control signal; and a comparator for comparing a reference voltage with a voltage of a node between the first and second resistors, the comparator having an output connected to a gate of the PMOS transistor. The first and second program verification control signals are selectively activated to change levels of the program verification voltages. The word line level selector applies a programming voltage, a read voltage, a pass voltage or an erase voltage to the word lines of the flash memory cells according to operation modes.

In another aspect of the present invention, there is provided a method of verifying whether the flash memory cells contained in a flash memory device are programmed or not, by applying predetermined programming voltages to the flash memory cells; generating program verification voltages selectively in response to the program verification voltages; and verifying whether the flash memory cells are programmed or not in response to the program verification voltages, in which program unit loop cycles including first to third steps are repeatedly carried out until the programming of the flash memory cells is completed and the program verification voltages are changed at each program unit loop cycle.

Additionally, the flash memory cells that are verified as uncertain as to whether they are programmed or not can be completely programmed since the program verification operation is carried out while changing the program verification voltage levels.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A flash memory device comprising:
    a memory cell array block having a plurality of flash memory cells arrayed therein;
    a program verification voltage generator structured to variably generate program verification voltages to verify whether the flash memory cells are programmed or not; and
    a word line level selector structured to transfer the program verification voltages to word lines connected to control gates of the flash memory cells;
    wherein the program verification voltage generator comprises:
        a PMOS transistor and a series of resistors, which are connected between a power supply voltage and a ground reference voltage;
        a first NMOS transistor connected to both terminals of a first resistor and structured to electrically short the first resistor in response to a first program verification control signal and to generate a program verification voltage at a node between drains of the PMOS transistor and the first NMOS transistor;

a second NMOS transistor connected to both terminals of a second resistor and structured to electrically short the second resistor in response to a second program verification control signal; and a comparator structured to compare a reference voltage to a voltage of a node between the first and second resistors, and having an output connected to a gate of the PMOS transistor.

2. The flash memory device of claim 1, wherein the first and second program verification control signals are selectively activated to change levels of the program verification voltages.

3. The flash memory device of claim 1, wherein the word line level selector is structured to apply a programming voltage, a read voltage, a pass voltage, or an erase voltage to the word lines of the flash memory cells according to operation modes.

4. In a flash memory device including one or more flash memory cells, a method of verifying whether the flash memory cells are programmed or not for a specific program logic level, the method comprising:

repeating a program unit loop cycle of:
applying predetermined programming voltages to the flash memory cells,
variably generating program verification voltages, and
verifying whether the flash memory cells are programmed or not in response to the program verification voltages;
until the programming of the flash memory cells is completed for the specific program logic level, wherein the program verification voltages are changed between two or more program unit loop cycles.

5. The method of claim 4, wherein the program verification voltage at an nth program unit loop cycle has a higher voltage level than the program verification voltage at an (n−1)th program unit loop cycle.

6. The method of claim 5, wherein the program verification voltage at an (n+1)th program unit loop cycle has a lower voltage level than the program verification voltage at the nth program unit loop cycle.

7. The method of claim 6, wherein the program verification voltage at the (n−1)th program unit loop cycle has the same level as the program verification voltage at the (n+1)th program unit loop cycle.

8. The method of claim 4, wherein the program verification voltages at the (n−1)th, nth and (n+1)th program unit loop cycles have different voltage levels from each other.

9. The method of claim 4, wherein the program verification voltage at an nth program unit loop cycle has a lower voltage level than the program verification voltage at an (n−1)th program unit loop cycle, and the program verification voltage at an (n+1)th program unit loop cycle has a lower voltage level than the program verification voltage at the nth program unit loop cycle.

10. A programming unit for a non-volatile memory device, comprising:
a first input structured to accept a programming verification control signal;
a second input structured to accept a second programming verification control signal;
a voltage generator structured to generate at an output a programming verification voltage having a voltage level selected from more than two possible levels, the voltage level of the programming verification voltage dependent on a state of the programming verification control signals; and
a word line transfer unit coupled to the output of the voltage generator and structured to transfer the programming verification voltage to one or more word lines in the memory device.

11. The programming unit of claim 10 wherein the first input is coupled to a control gate of a transistor and wherein the second input is coupled to a control gate of a second transistor.

12. The programming unit of claim 10 wherein the voltage generator comprises;
a serial transistor coupled to a voltage supply;
a first and second resistor coupled in series between the serial transistor and a ground reference voltage;
a first control transistor coupled across the first resistor and structured to cause a short across the first resistor when controlled by the programming verification control signal; and
a second control transistor coupled across the second resistor and structured to cause a short across the second resistor when controlled by the second programming verification control signal.

13. The programming unit of claim 12, further comprising:
a comparator structured to compare a voltage of a node between the first and second transistors to a reference voltage.

14. The programming unit of claim 13 wherein an output of the comparator is coupled to a control input of the serial transistor.

15. A flash memory device comprising:
a memory cell array block having a plurality of flash memory cells arranged in word lines and bit lines;
a program verification voltage generator structured to generate a program verification voltage to be supplied to a selected word line every program loop; and
a word line level selector structured to transfer the program verification voltage to the selected word line connected to control gates of the flash memory cells;
wherein the program verification voltage generator is structured to generate the program verification voltage at an nth program unit loop cycle so as to be higher or lower than that for a (n−1)th program unit loop cycle.

16. The flash memory device of claim 15, wherein the program verification voltage at the nth program unit loop cycle has a higher voltage level than the program verification voltage at the (n−1)th program unit loop cycle.

17. The flash memory device of claim 16, wherein the program verification voltage at an (n+1)th program unit loop cycle has lower voltage level than the program verification voltage at the nth program unit loop cycle.

18. The flash memory device of claim 17, wherein the program verification voltage at the (n−1)th, nth and (n+1)th program unit loop cycles have different voltage levels from each other.

19. The flash memory device of claim 15, wherein the program verification voltage at the nth program unit loop cycle has a lower voltage level than the program verification voltage at the (n−1)th program unit loop cycle, and the program verification voltage at an (n+1)th program unit loop cycle has a lower voltage level than the program verification voltage at the nth program unit loop cycle.

20. The flash memory device of claim 15, wherein the word line level selector is structured to apply a programming voltage, a read voltage, a pass voltage, or an erase voltage to the word lines of the flash memory cells according to operation modes.

21. A flash memory device comprising:
a memory cell array block having a plurality of flash memory cells arranged in word lines and bit lines; and
a program verification voltage generator structured to generate a program verification voltage to be supplied to a selected word line every program loop;
the program verification voltage generator structured to generate the program verification voltage at an nth program unit loop cycle to be higher or lower than that for a (n−1)th program unit loop cycle;
wherein the program verification voltage at the nth program unit loop cycle has a higher voltage level than the program verification voltage at the (n−1)th program unit loop cycle and the program verification voltage at an (n+1)th program unit loop cycle has lower voltage level than the program verification voltage at the nth program unit loop cycle; and
the program verification voltage at the (n−1)th program unit loop cycle has the same level as the program verification voltage at the (n+1)th program unit loop cycle.

22. A flash memory device comprising:
a memory cell array block having a plurality of flash memory cells arranged in word lines and bit lines; and
a program verification voltage generator structured to generate a program verification voltage to be supplied to a selected word line every program loop;
wherein the program verification voltage generator is structured to generate the program verification voltage at an nth program unit loop cycle so as to be higher or lower than that for a (n−1)th program unit loop cycle; and
wherein the program verification voltage generator comprises:
a PMOS transistor and series of resistors, which are connected between a power supply voltage and a ground reference voltage;
a first NMOS transistor connected to both terminals of a first resistor and structured to electrically short the first resistor in response to a first program verification control signal and to generate a program verification voltage at a node between drains of the PMOS transistor and the first NMOS transistor;
a second NMOS transistor connected to both terminals of a second resistor and structured to electrically short the second resistor in response to a second program verification control signal; and
a comparator structured to compare a reference voltage to a voltage of a node between the first and second resistors, and having an output connected to a gate of the PMOS transistor.

23. The flash memory device of claim 22, wherein the first and second program verification control signals are selectively activated to change levels of the program verification voltage.

* * * * *